US012707800B2

(12) United States Patent
Kim et al.

(10) Patent No.: US 12,707,800 B2
(45) Date of Patent: Aug. 11, 2026

(54) METHOD FOR MANUFACTURING GRAPHENE LIGHT SOURCE, ORGANIC LIGHT-EMITTING DEVICE COMPRISING GRAPHENE LIGHT SOURCE, AND METHOD FOR MANUFACTURING ORGANIC LIGHT-EMITTING DEVICE

(71) Applicant: University-Industry Cooperation Group Of Kyung Hee University, Gyeonggi-do (KR)

(72) Inventors: Youngduck Kim, Seongnam-si (KR); Min Hyun Cho, Seoul (KR); Seokwon Kang, Yongin-si (KR)

(73) Assignee: University-Industry Cooperation Group of Kyung Hee University, Gyeonggi-do (KR)

( * ) Notice: Subject to any disclaimer, the term of this patent is extended or adjusted under 35 U.S.C. 154(b) by 422 days.

(21) Appl. No.: 18/570,988

(22) PCT Filed: Oct. 19, 2021

(86) PCT No.: PCT/KR2021/014590
§ 371 (c)(1),
(2) Date: Dec. 15, 2023

(87) PCT Pub. No.: WO2023/022294
PCT Pub. Date: Feb. 23, 2023

(65) Prior Publication Data

US 2024/0224565 A1 Jul. 4, 2024

(30) Foreign Application Priority Data

Aug. 20, 2021 (KR) ........................ 10-2021-0109988

(51) Int. Cl.
*H10K 50/115* (2023.01)
*H10K 50/12* (2023.01)
*H10K 71/20* (2023.01)

(52) U.S. Cl.
CPC ........... *H10K 50/115* (2023.02); *H10K 50/12* (2023.02); *H10K 71/231* (2023.02)

(58) Field of Classification Search
CPC .... H10K 50/115; H10K 50/12; H10K 71/231; H10K 50/17; H10K 50/11; H10K 71/00;
(Continued)

(56) References Cited

U.S. PATENT DOCUMENTS 9,166,099 B2 10/2015 Hwang et al.
9,331,283 B2 * 5/2016 Lim .................... H10K 85/114
(Continued)

FOREIGN PATENT DOCUMENTS

CN 106990563 A 7/2017
KR 10-2012-0029339 A 3/2012
(Continued)

OTHER PUBLICATIONS

Liqian Bai et al., Dual-mode emission of single-layered graphene quantum dots in confined nanospace: Anti-counterfeiting and sensor applications, Nano Research, 2018.
(Continued)

*Primary Examiner* — Allison Bernstein
(74) *Attorney, Agent, or Firm* — Harness, Dickey & Pierce, P.L.C.

(57) ABSTRACT

Provided are a method for manufacturing a graphene light source, wherein the method includes forming a graphene layer and electrodes in contact with both sides of the graphene layer, forming a nano-gap of the graphene layer, and forming a graphene oxide layer by bonding ionized oxygen to a portion of the graphene layer adjacent to one
(Continued)

side of the nano-gap, wherein the graphene oxide layer emits green light or blue light, an organic light emitting element including the graphene light source, and a method for manufacturing the organic light emitting element.

20 Claims, 14 Drawing Sheets

(58) Field of Classification Search
CPC .... H10K 85/20; H10D 62/882; H10H 20/014; H10H 20/826; C09K 11/65; H05B 33/14; B82Y 10/00; B82Y 20/00
See application file for complete search history.

(56) References Cited

U.S. PATENT DOCUMENTS

| | | | | |
|---|---|---|---|---|
| 10,408,948 | B2 | 9/2019 | Kang et al. | |
| 12,006,457 | B2 * | 6/2024 | Jeon | C09K 11/65 |
| 2016/0064681 | A1 | 3/2016 | Lee et al. | |
| 2022/0052284 | A1 * | 2/2022 | Kida | H10K 50/818 |

FOREIGN PATENT DOCUMENTS

| | | | |
|---|---|---|---|
| KR | 10-2012-0067158 | A | 6/2012 |
| KR | 10-2015-0120025 | A | 10/2015 |
| KR | 10-2016-0025337 | A | 3/2016 |
| KR | 10-1687526 | B1 | 12/2016 |
| KR | 10-1873627 | B1 | 7/2018 |
| KR | 10-2021-0037286 | A | 4/2021 |

OTHER PUBLICATIONS

Anna P. Ovvyan et al., An electroluminescent and tunable cavity-enhanced carbon-nanotube-emitter in the telecom band, nature communications, 2023.
Hyungsik Kim et al., Electroluminescence of atoms in a graphene nanogap, Science Advances, 2022.
International Search Report for International Application No. PCT/KR2021/014590 dated Aug. 19, 2021.

* cited by examiner

100
EL2
EL21
EL22
132
112
G0
131
111
I'
230
210
133
113
EL12
EL11
EL1
I
D3
D2
D1

METHOD FOR MANUFACTURING GRAPHENE LIGHT SOURCE, ORGANIC LIGHT-EMITTING DEVICE COMPRISING GRAPHENE LIGHT SOURCE, AND METHOD FOR MANUFACTURING ORGANIC LIGHT-EMITTING DEVICE

CROSS-REFERENCE TO RELATED APPLICATIONS

This application is a national phase under 35 U.S.C. § 371 of PCT International Application No. PCT/KR2021/014590 which has an International filing date of Oct. 19, 2021 which claims priority to Korean Application No. 10-2021-0109988, filed Aug. 20, 2021 the entire contents of each of which are hereby incorporated by reference.

BACKGROUND

The present disclosure herein relates to a method for manufacturing a graphene light source, an organic light emitting element including the graphene light source, and a method for manufacturing the organic light emitting element.

Various light elements using photonics technology are typically built on silicon-on-insulator (SOI) wafers. Such light elements include light sources, photodetectors, optical modulators, photodiodes, polarization rotators, polarization splitters, wavelength division multiplexers, wavelength division demultiplexers, optical power splitters, and the like.

Meanwhile, graphene is a material having a two-dimensional planar structure in which carbon atoms are connected in a honeycomb-shaped hexagonal form through an sp2 bond. The graphene has high electron mobility, high light transmittance, and excellent thermal conductivity, and thus, may be used for various purposes in industrial fields such as semiconductors, energy, and displays. Particularly, research has been actively conducted to apply the graphene to various light elements using the photonics technology.

SUMMARY

The present disclosure provides a method for manufacturing a graphene light source, wherein the method includes forming a graphene quantum dot (GQD), an organic light emitting element including the graphene light source, and a method for manufacturing the organic light emitting element.

Objects to be achieved by the present invention are not limited to the object mentioned above, and other objects that are not mentioned above will be clearly understood by those skilled in the art from the following description.

An embodiment of the inventive concept provides a method for manufacturing a graphene light source, the method including forming a graphene layer and electrodes in contact with both sides of the graphene layer, forming a nano-gap of the graphene layer, and forming a graphene oxide layer by bonding ionized oxygen to a portion of the graphene layer adjacent to one side of the nano-gap, wherein the graphene oxide layer emits green light or blue light.

In an embodiment, the forming of the nano-gap may include applying a first voltage to the electrodes.

In an embodiment, the forming of the nano-gap may include performing a patterning process on the graphene layer.

In an embodiment, the patterning process may be an E-beam lithography process.

In an embodiment, the forming of the nano-gap may include applying a first voltage to the electrodes, and the forming of the graphene oxide layer may include applying a second voltage to the electrodes, wherein the first voltage and the second voltage may be about 5 V to about 40 V.

In an embodiment, the method may further include reducing the graphene oxide layer by applying a third voltage to the electrodes, wherein the third voltage may be smaller than the first voltage and the second voltage.

In an embodiment, the third voltage may be about 5 V to about 30 V.

In an embodiment, the electrodes may include a first electrode and a second electrode, and the graphene layer may include a first portion adjacent to the first electrode, a second portion adjacent to the second electrode, a third portion connected to the first portion and decreasing in width toward the second portion, a fourth portion connected to the second portion and decreasing in width toward the first portion, and a fifth portion provided between the third portion and the fourth portion.

In an embodiment, the forming of the nano-gap may include removing the fifth portion of the graphene layer.

In an embodiment, the width of the nano-gap may be about 0.6 nm to about 10 nm.

In an embodiment, the method may further include injecting gas containing nitrogen into the graphene layer, wherein the graphene layer may include graphene not doped with impurities or graphene doped with nitrogen.

In an embodiment, the nano-gap may be formed at a predetermined position according to the shape or manufacturing process of the graphene layer.

In an embodiment of the inventive concept, an organic light emitting element including a graphene light source includes a substrate, a hole injection layer on the substrate, a hole transport layer on the hole injection layer, a graphene oxide layer on the hole transport layer, an electron transport layer on the graphene oxide layer, an electron injection layer on the electron transport layer, a first electrode electrically connected to the hole injection layer, and a second electrode electrically connected to the electron injection layer, wherein the graphene oxide layer includes a graphene quantum dot, and the graphene oxide layer is configured to emit green light or blue light.

In an embodiment, the graphene quantum dot may include ionized oxygen atoms.

In an embodiment, the graphene layer may include graphene not doped with impurities or graphene doped with nitrogen.

In an embodiment, the graphene oxide layer may have a mono-layer structure or a multi-layer structure in which 2 to 10 layers are stacked.

In an embodiment, the graphene oxide layer may include a hydroxyl group having an oxygen functional group bonded to a carbon atom.

In an embodiment of the inventive concept, a method for manufacturing an organic light emitting element including a graphene light source includes sequentially forming a hole injection layer, a hole transport layer, and a graphene layer on a substrate, forming electrodes in contact with both sides of the graphene layer, forming a graphene quantum dot in the graphene layer, performing a patterning process on the hole injection layer, the hole transport layer, and the graphene layer, sequentially forming an electron transport layer and an electron injection layer on the graphene quantum dot of the graphene layer, and electrically connecting the electrodes to the hole injection layer and the electron injection layer, wherein the forming of the graphene quantum dot includes forming a nano-gap of the graphene layer, and forming a graphene oxide layer by bonding ionized oxygen to a portion of the graphene layer adjacent to one side of the nano-gap.

In an embodiment, the graphene layer adjacent to the other side of the nano-gap may be removed by the patterning process.

In an embodiment, the graphene oxide layer may be configured to emit green light or blue light.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
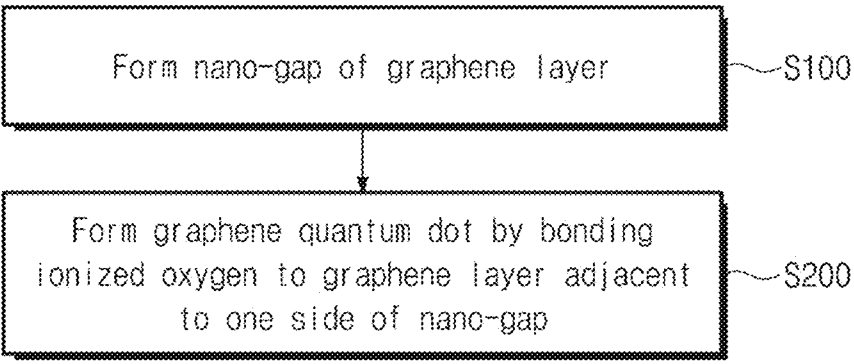
FIG. 1 is a flowchart for describing a method for manufacturing a graphene light source according to embodiments of the inventive concept.

In order to facilitate sufficient understanding of the configuration and effects of the present invention, preferred embodiments of the inventive concept will be described with reference to the accompanying drawings.

The inventive concept is not limited to the embodiments set forth below and may be embodied in various forms and modified and changed in many alternate forms. Rather, the present embodiments are provided so that the disclosure of the inventive concept will be thorough and complete, and will fully convey the scope of the present invention to those skilled in the art to which the inventive concept pertains. In the accompanying drawings, for convenience of description, the ratio of each element may be exaggerated or reduced.

The terms used herein are for the purpose of describing the embodiments and are not intended to be limiting of the present invention. Unless otherwise defined, terms used herein may be interpreted as having meanings commonly known to those skilled in the art.

In the present specification, singular forms include plural forms unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices.

Although the terms first, second, and the like are used in the present specification to describe various regions, directions, shapes, and the like, these regions, directions, shapes, and the like should not be limited by these terms. These terms are only used to distinguish any predetermined region, direction, or shape from another region, direction, or layer. Thus, a portion referred to as a first portion in one embodiment may be referred to as a second portion in another embodiment. The embodiment described and exemplified herein also includes a complementary embodiment thereof. Like reference numerals refer to like elements throughout the specification.

Hereinafter, with reference to the accompanying drawings, a method for manufacturing a graphene light source, an organic light emitting element including the graphene light source, and a method for manufacturing the organic light emitting element according to embodiments of the inventive concept will be described in detail.

FIG. 1 is a flowchart for describing a method for manufacturing a graphene light source according to embodiments of the inventive concept.

Referring to FIG. 1, the method for manufacturing a graphene light source according to the inventive concept may include forming a graphene layer and electrodes in contact with both sides of the graphene layer, forming a nano-gap of the graphene layer S100, and forming a graphene oxide layer by bonding ionized oxygen to a portion of the graphene layer adjacent to one side of the nano-gap S200. Hereinafter, referring to FIG. 2A, FIG. 2B, FIG. 2C, and FIG. 2D, the method for manufacturing a graphene light source according to the inventive concept will be described in detail.

FIG. 2A, FIG. 2B, FIG. 2C, and FIG. 2D are perspective views for describing a method for manufacturing a graphene light source according to embodiments of the inventive concept.

Figure 2A:
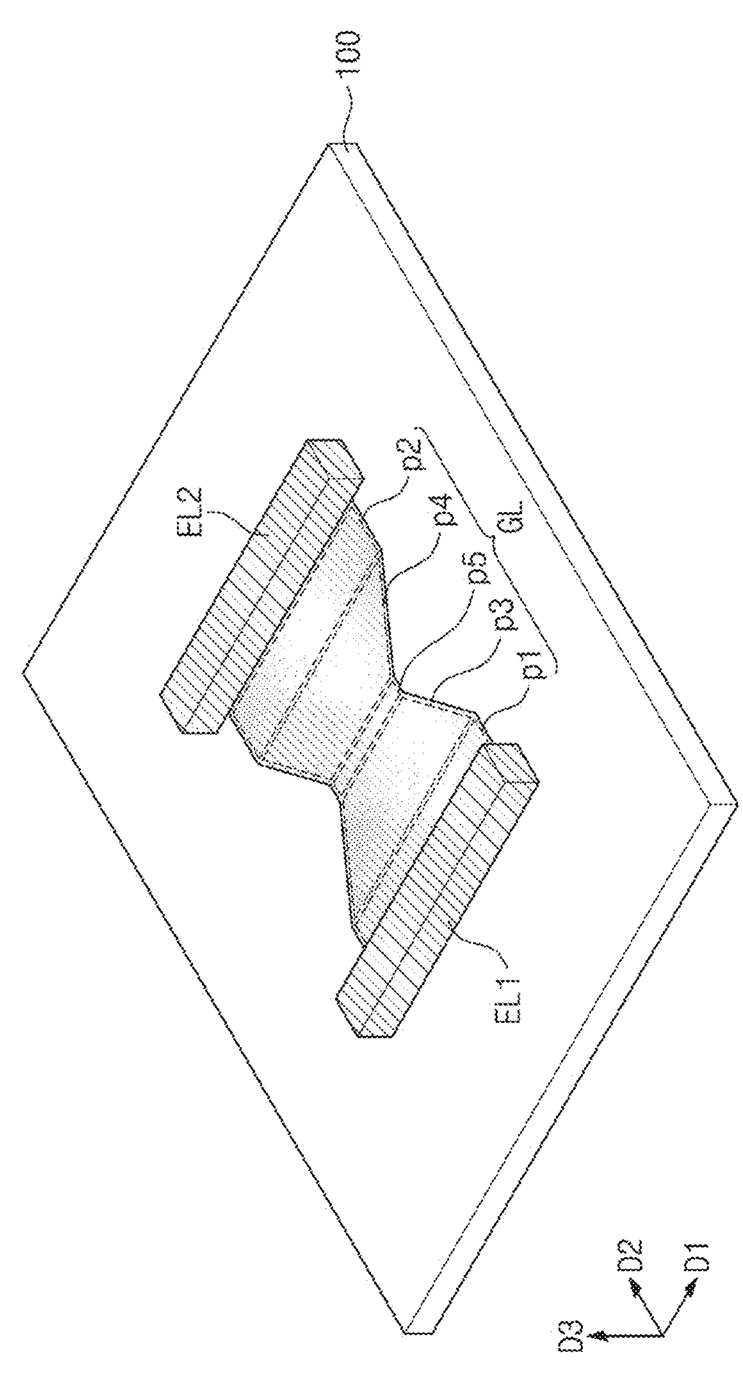
FIG. 2A, FIG. 2B, FIG. 2C, and FIG. 2D are perspective views for describing a method for manufacturing a graphene light source according to embodiments of the inventive concept.

Referring to FIG. 2A, a graphene layer GL may be provided on a substrate 100. The substrate 100 may be, for example, a semiconductor substrate including silicon or the like, or a silicon-on-insulator (SOI) substrate including a silicon oxide. However, this is only an example, and the embodiment of the inventive concept is not limited thereto, and the substrate 100 may include various materials such as sapphire or alumina ($Al_2O_3$) depending on the embodiments. The substrate 100 may have an upper surface, which is parallel to a first direction D1 and a second direction D2 intersecting the first direction D1, and orthogonal to a third direction D3. The first to third directions D1, D2, and D3 may be, for example, directions orthogonal to each other.

The graphene layer GL may have, for example, a monolayer structure or a multi-layer structure in which 2 to 10 layers are stacked. In other words, the graphene layer GL may have substantially a two-dimensional structure. The graphene layer GL only includes, for example, carbon atoms, and may include graphene not doped with impurities. The graphene layer GL may include, for another example, graphene doped with impurities (e.g., nitrogen). Although not illustrated, other layers may be interposed between the substrate 100 and the graphene layer GL.

The graphene layer GL may include a first portion p1 adjacent to a first electrode EL1, a second portion p2 adjacent to a second electrode EL2, a third portion p3 connected to the first portion p1 and decreasing in width in a first direction D1 toward a second direction D2, a fourth portion p4 connected to the second portion p2 and increasing in width in the first direction D1 from the first direction D1 to the second direction D2, and a fifth portion p5 between the third portion p3 and the fourth portion p4. The first portion p1, the second portion p2, and the fifth portion p5 may each have a constant width in the first direction DL. The width of the first portion p1 in the first direction D1 may be substantially the same as the width of the second portion p2 in the first direction D1. The width of the fifth portion p5 in the first direction D1 may be smaller than the width of each of the first portion p1 and the second portion p2 in the first direction D1.

The graphene layer GL may have, for example, a bow-tie shape including the first to fifth portions p1 to p5 as described above, but this is only an example, and the embodiment of the inventive concept is not limited thereto, and the graphene layer GL may have a variety of shapes.

The first electrode EL1 and the second electrode EL2 adjacent to each other in the second direction D2 may be provided on each side of the graphene layer GL. The first electrode EL1 and the second electrode EL2 may be spaced apart from each other in the second direction D2. The thickness of each of the first electrode EL1 and the second electrode EL2 in the third direction D3 may be greater than the thickness of the graphene layer GL in the third direction D3. Each of the first electrode EL1 and the second electrode EL2 may include a metal material. Each of the first electrode EL1 and the second electrode EL2 may be connected to a conductive line and/or an additional electrode.

Figure 2B:
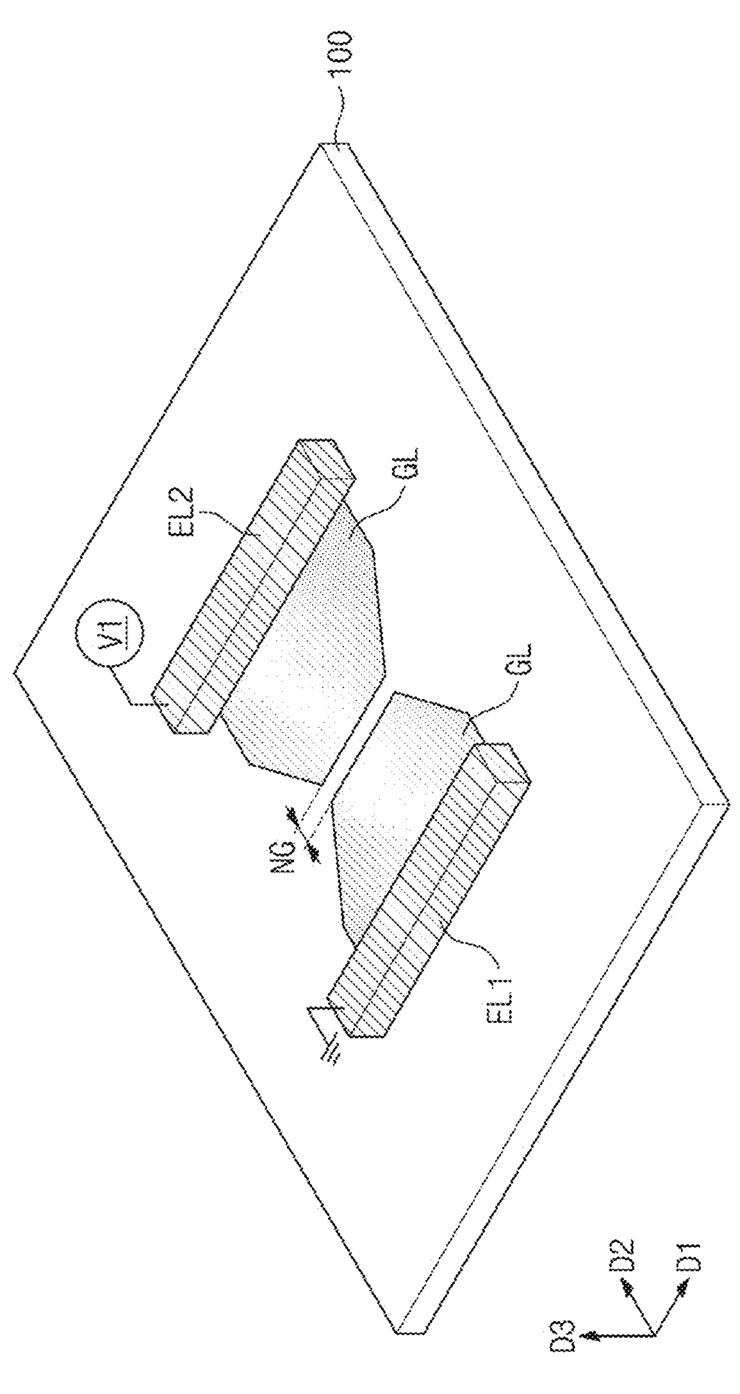

Referring to FIG. 2A and FIG. 2B, a nano-gap NG of the graphene layer GL may be formed. The graphene layer GL may be divided into two portions which are spaced apart from each other in the second direction D2 with the nano-gap NG interposed therebetween. Referring to FIG. 2A, the fifth portion p5 of the graphene layer GL may be removed, thereby forming the nano-gap NG, and the third portion p3 and the fourth portion p4 may be spaced apart from each other in the second direction D2. The width of the nano-gap NG in the second direction D2 may be, for example, about 0.1 nm to about 20 nm. The width of the nano-gap NG in the second direction D2 may be, more preferably, about 0.6 nm to about 10 nm.

As an example, as a first voltage V1 is applied to the second electrode EL2 (i.e., there is a first potential difference occurring between the first electrode EL1 and the second electrode EL2), the current density of the graphene layer GL may increase (i.e., a charge may be injected into the graphene layer GL), and the graphene layer GL may exhibit thermal radiation properties due to Joule heating. Thermal radiation and electromigration phenomena may cause some of carbon bonds of the graphene layer GL to break, thereby forming the nano-gap NG.

As another example, a patterning process on the graphene layer GL may also form the nano-gap NG. The patterning process may be, for example, an E-beam lithography process. When the nano-gap NG is formed by the patterning process, the graphene layer GL may be more free from shape constraints.

Figure 2C:
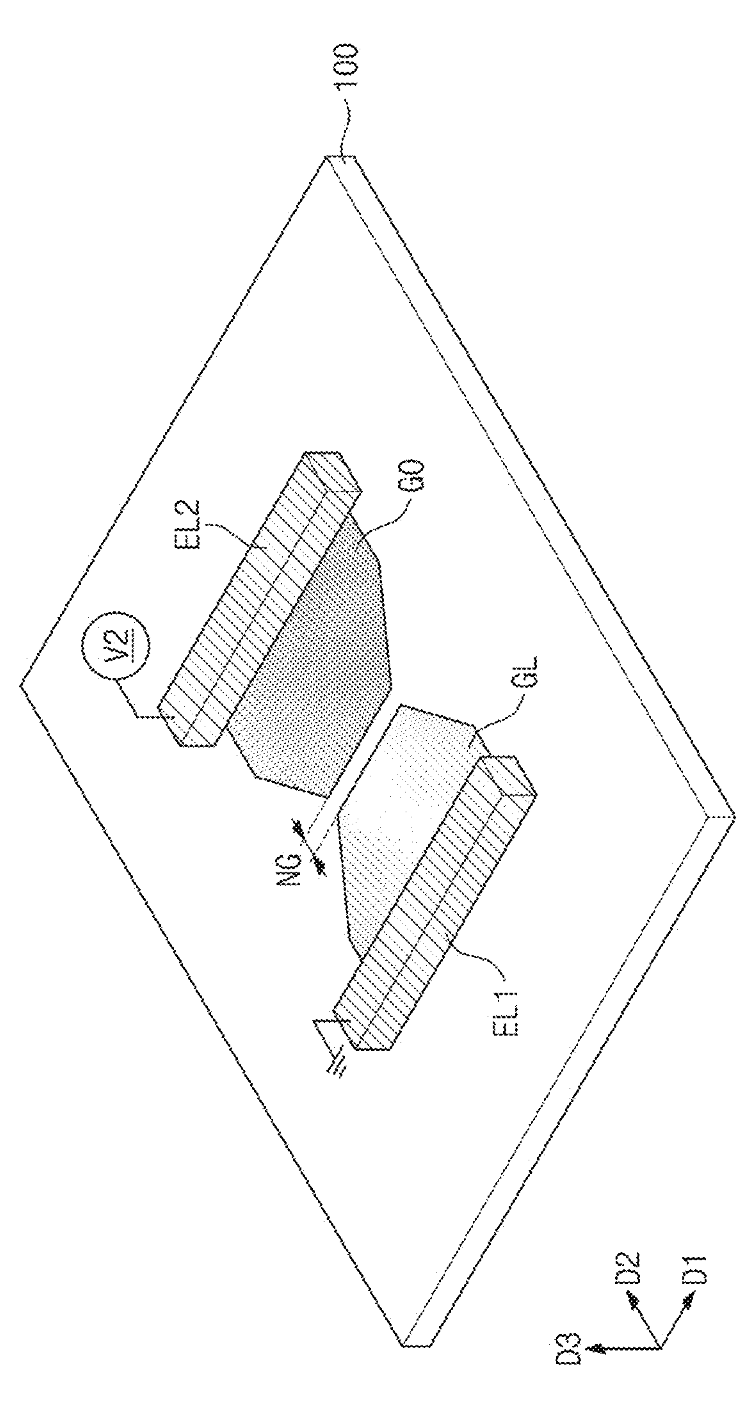

Referring to FIG. 2B and FIG. 2C, as a second voltage V2 is applied to the second electrode EL2 (i.e., there is a second potential difference occurring between the first electrode EL1 and the second electrode EL2), an oxygen atom ionized by plasma may be bonded to the graphene layer GL in contact with the second electrode EL2 (oxygen adsorption) (i.e., the graphene layer GL may be oxidized), and a graphene oxide layer GO may be formed. That is, as the second voltage V2 is applied to the second electrode EL2, a graphene quantum dot may be formed. The graphene quantum dot may include ionized oxygen atoms. More specifically, dangling bonds may be formed in carbon atoms of the graphene layer GL which have bonds that are broken due to heat radiation, and oxygen atoms may be bonded to the dangling bonds.

The second voltage V2 may be substantially the same as the first voltage V1. Each of the first voltage V1 and the second voltage V2 may be, for example, about 5 V to about 40 V. The forming of the nano-gap NG and the forming of the graphene oxide layer GO may be performed substantially simultaneously.

The graphene oxide layer GO and the graphene layer GL in contact with the first electrode EL1 may be spaced apart from each other in the second direction D2 with the nano-gap NG interposed therebetween. The graphene oxide layer GO may include a hydroxyl group bonded to a carbon atom. The hydroxyl group in the graphene oxide layer GO may have a variety of oxygen functional groups.

Figure 2D:
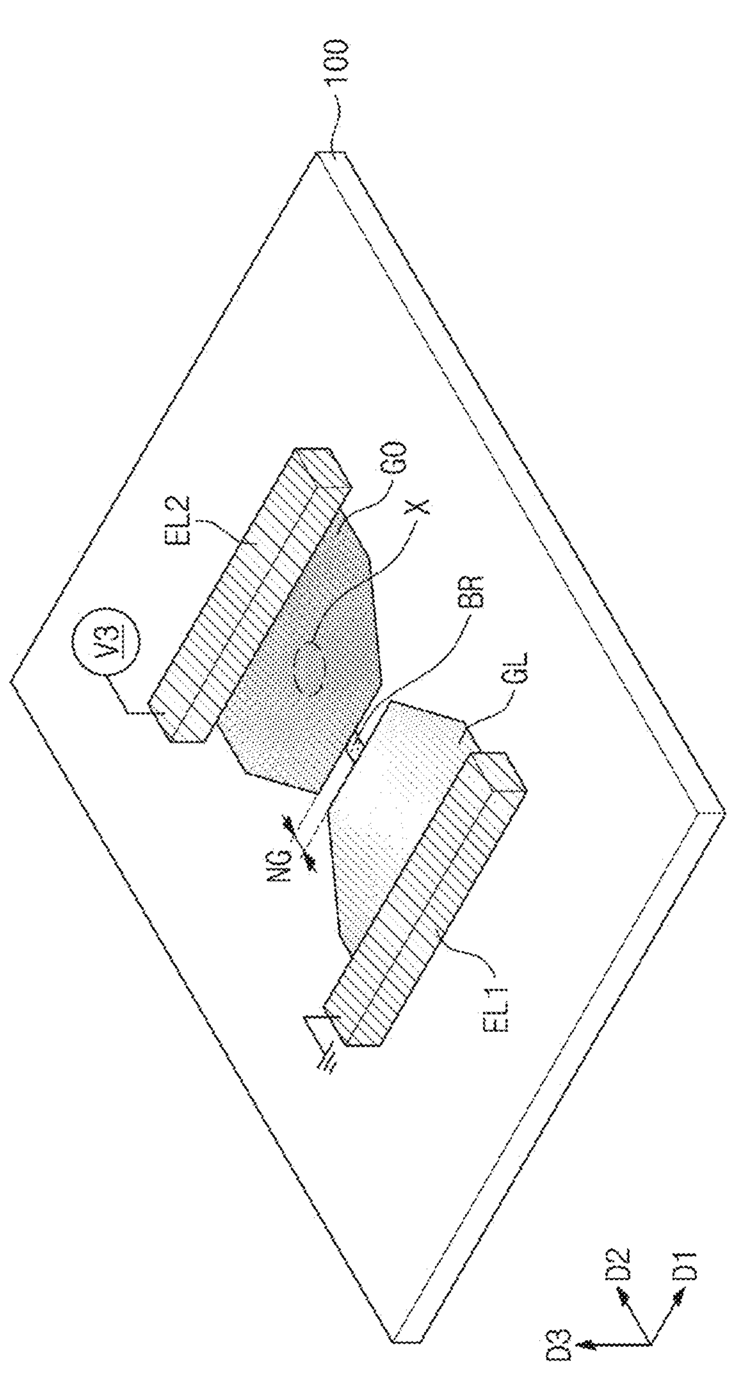

Referring to FIG. 2C and FIG. 2D, as a third voltage V3 is applied to the second electrode EL2 (i.e., there is a third potential difference occurring between the first electrode EL1 and the second electrode EL2), the graphene oxide layer GO may be reduced. The third voltage V3 may be smaller than the second voltage V2. The third voltage V3 may be, for example, about 5 V to about 30 V. More specifically, as the third voltage V3, which is lower than the second voltage V2, is applied to the second electrode EL2, the electromigration phenomenon occurs less, so that the graphene oxide layer GO may lose oxygen atoms.

Additionally, a bridge BR may be formed between the graphene layer GL and the graphene oxide layer GO. The bridge BR may be formed by the connection between some of carbon atoms of the graphene layer GL and some of carbon atoms of the graphene oxide layer GO while the graphene oxide layer GO is reduced.

The graphene oxide layer GO may emit green light or blue light. That is, a graphene quantum dot including ionized oxygen atoms may emit green light or blue light. For example, when graphene not doped with impurities is used, the graphene oxide layer GO may emit green light (i.e., a graphene light source according to the inventive concept may be a green light source). As another example, when nitrogen-doped graphene is used, the graphene oxide layer GO may emit blue light (i.e., a graphene light source according to the inventive concept may be a blue light source).

In the case of using nitrogen-doped graphene, the method for manufacturing a graphene light source according to the inventive concept may further include injecting a gas containing nitrogen into the graphene layer GL. For example, the injecting of a gas containing nitrogen may be performed before the forming of the nano-gap NG of the graphene layer GL, but the embodiment of the inventive concept is not limited thereto. The gas may be, for example, a compound gas such as pyridine.

The method for manufacturing a graphene light source according to the inventive concept may be performed by an in-situ process. In addition, the method for manufacturing a graphene light source according to the inventive concept may be applied (compatible) to a CMOS process, and may be easily implemented to a large area. In addition, according to the inventive concept, it is possible to control the formation position of the nano-gap NG, and accordingly, the light emission position thereof. More specifically, according to the shape or manufacturing process of the graphene layer GL, it is possible to form the nano-gap NG at a predetermined (or desired) position, and accordingly, to control the light emission position thereof.

Figure 3A:
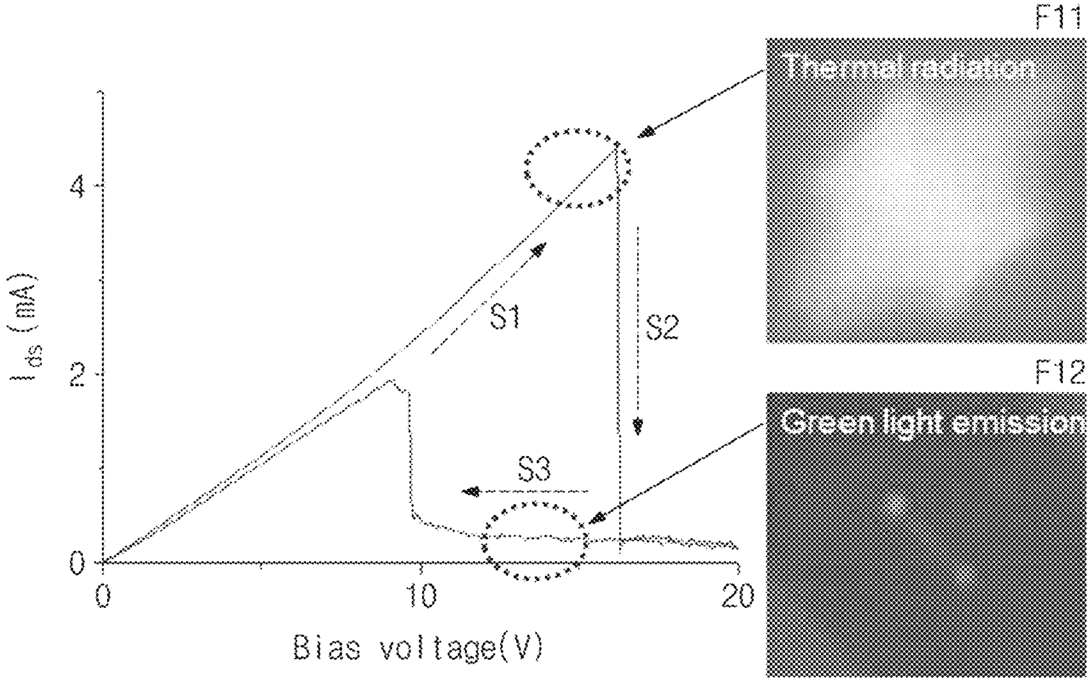
FIG. 3A, FIG. 3B, and FIG. 3C are diagrams for describing the green light emission principle of a graphene light source according to embodiments of the inventive concept.
Figure 3B:
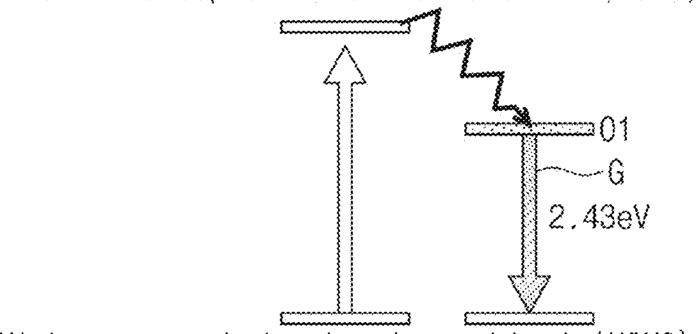
Figure 3C:
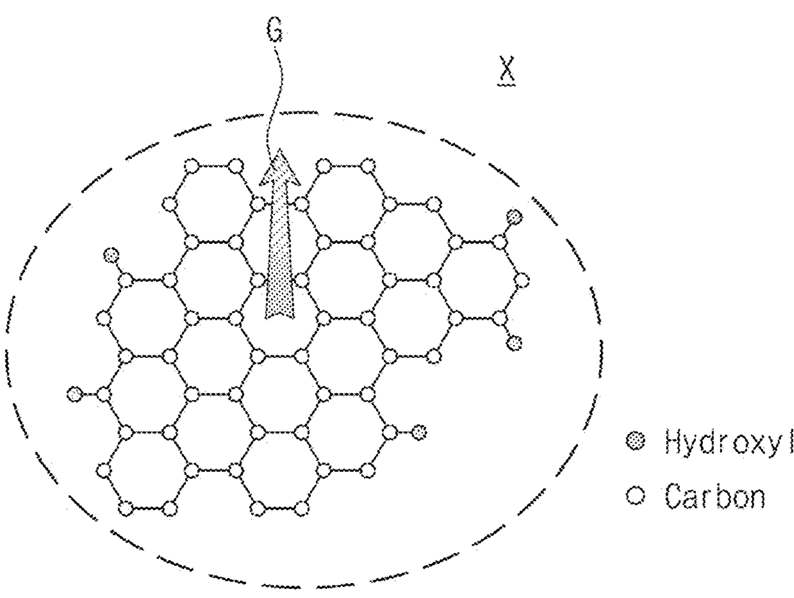

FIG. 3A illustrates a graph showing current Ids characteristics of a graphene layer according to a bias voltage applied to electrodes in contact with both sides of the graphene layer and photographs showing a light emission phenomenon of the graphene layer at each stage in which the current changes. FIG. 3B and FIG. 3C are conceptual diagrams for describing the green light emission principle of a graphene light source according to embodiments of the inventive concept. In the graph of FIG. 3A, the unit of bias voltage is volt (V), and the unit of current is milliampere (mA). FIG. 3C corresponds to portion X of FIG. 2D.

FIG. 3A is the measurement and photograph of the graphene layer GL containing graphene not doped with impurities. Referring to FIG. 2A to FIG. 2D, and FIG. 3A, when the voltage applied to the second electrode EL2 increases, the current flowing through the graphene layer GL increases S1. When a voltage greater than about 15 V is applied, thermal radiation properties are exhibited F11. Thereafter, at a voltage of about 16 V, a breakdown due to a thermal effect occurs (i.e., the current decreases rapidly) S2, at which time the nano-gap NG and the graphene oxide layers GO are formed. That is, a graphene quantum dot is formed. Thereafter, when the voltage applied to the second electrode EL2 decreases, the current flowing through the graphene oxide layer GO increases and then decreases S3. In a voltage range of about 10 V to about 20 V, the graphene layer GO with the formed graphene quantum dot emits green light G F12.

Referring to FIG. 2A to FIG. 2D, FIG. 3B, and FIG. 3C, the graphene oxide layer GO may include carbon atoms and hydroxyl groups bonded to carbon atoms positioned at the edge. In the graphene quantum dot, an electron may emit the green light G corresponding to a band gap of about 2.43 eV by being dropped from a first orbital O1, which is lower than the lowest unoccupied molecular orbital (hereinafter, LUMO), to the highest occupied molecular orbital (hereinafter, HOMO).

Figure 4A:
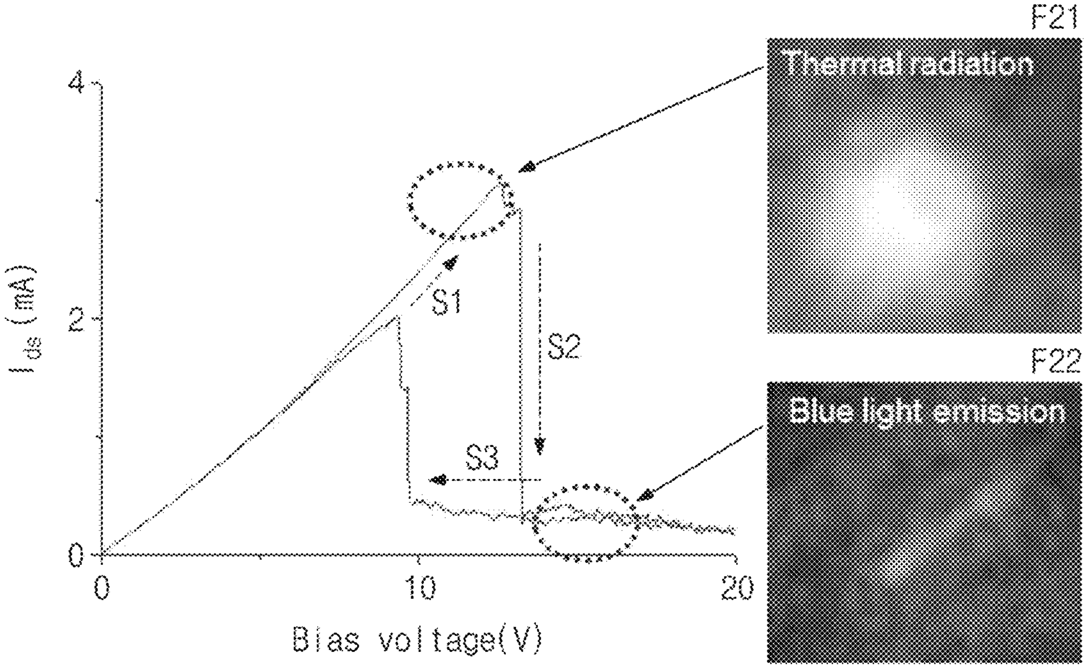
FIG. 4A, FIG. 4B, and FIG. 4C are diagrams for describing the blue light emission principle of a graphene light source according to embodiments of the inventive concept.
Figure 4B:
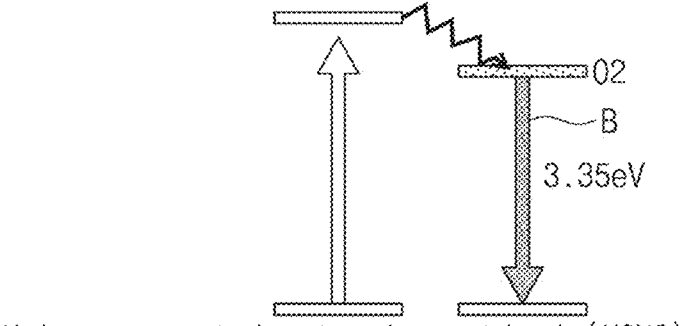
Figure 4C:
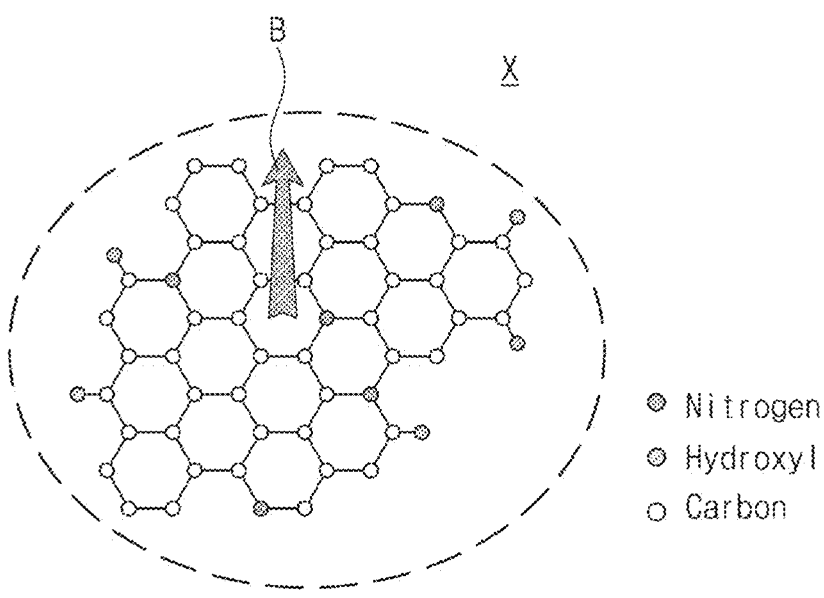

FIG. 4A illustrates a graph showing current characteristics of a graphene layer according to a bias voltage applied to electrodes in contact with both sides of the graphene layer and photographs showing a light emission phenomenon of the graphene layer at each stage in which the current changes. FIG. 4B and FIG. 4C are conceptual diagrams for describing the blue light emission principle of a graphene light source according to embodiments of the inventive concept. In the graph of FIG. 4A, the unit of bias voltage is volt (V), and the unit of current is milliampere (mA). FIG. 4C corresponds to portion X of FIG. 2D.

FIG. 4A is the measurement and photograph of the graphene layer GL containing graphene doped with nitrogen. Referring to FIG. 2A to FIG. 2D, and FIG. 4A, when the voltage applied to the second electrode EL2 increases, the current flowing through the graphene layer GL increases S1. When a voltage greater than about 11 V is applied, thermal radiation properties are exhibited F21. Thereafter, at a voltage of about 13 V, a breakdown due to a thermal effect occurs (i.e., the current decreases rapidly) S2, at which time the nano-gap NG and the graphene oxide layers GO are formed. That is, a graphene quantum dot is formed. Thereafter, when the voltage applied to the second electrode EL2 decreases, the current flowing through the graphene oxide layer GO increases and then decreases S3. In a voltage range of about 10 V to about 20 V, the graphene layer GO with the formed graphene quantum dot emits blue light B F22.

Referring to FIG. 2A to FIG. 2D, FIG. 4B, and FIG. 4C, the graphene oxide layer GO may include carbon atoms, nitrogen atoms doped between carbon atoms, and hydroxyl groups bonded to carbon atoms positioned at the edge. In the graphene quantum dot, an electrons may emit the blue light B corresponding to a band gap of about 3.35 eV by being dropped from a second orbital O2, which is lower than the LUMO, to the HOMO. The second orbital O2 may be closer to the LUMO than the above-described first orbital O1.

Figure 5A:
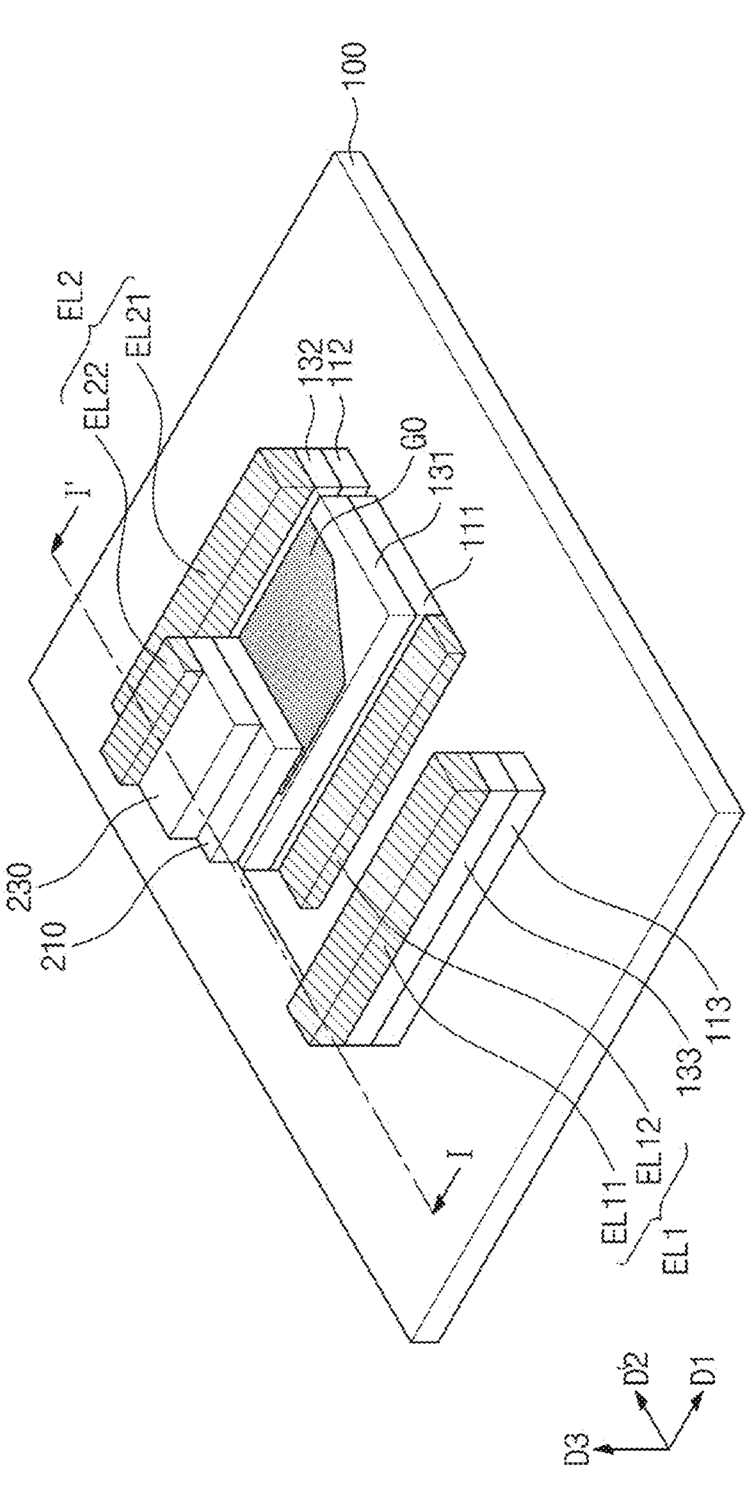
FIG. 5A is a perspective view for describing an organic light emitting element including a graphene light source according to embodiments of the inventive concept.
Figure 5B:
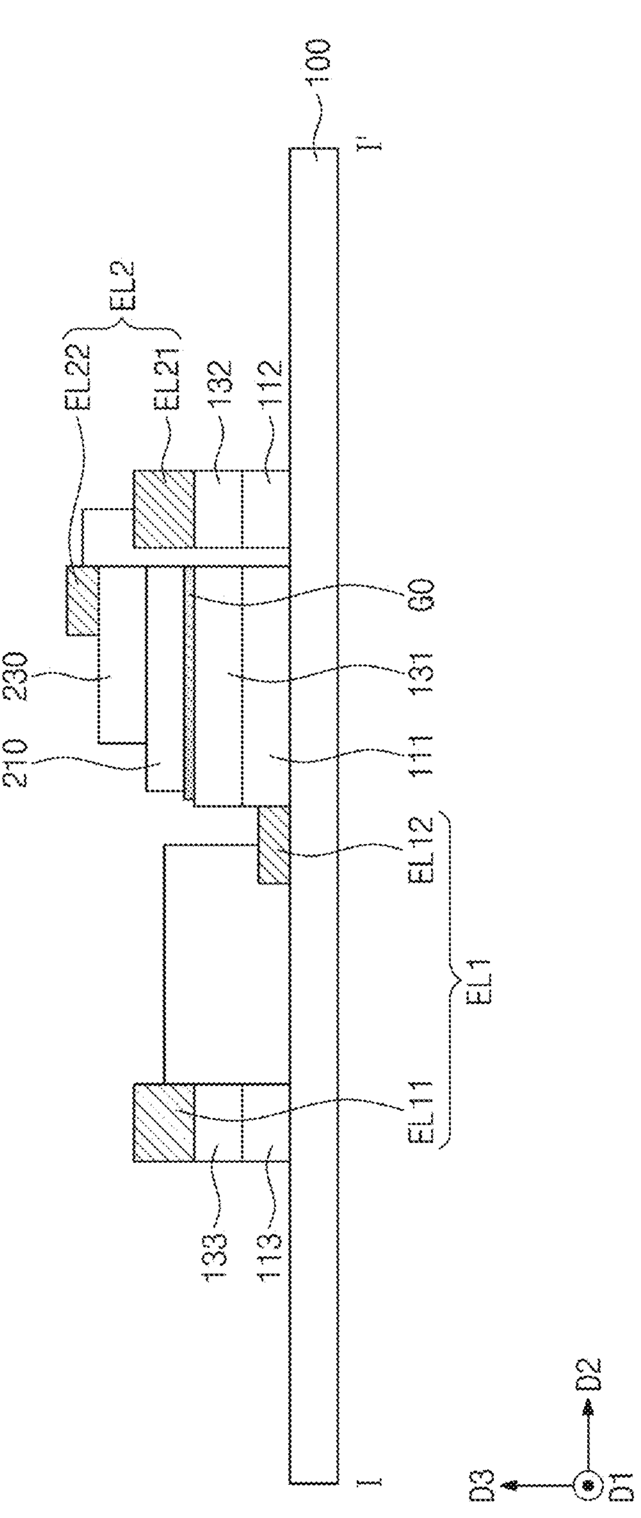
FIG. 5B is a cross-sectional view for describing an organic light emitting element including a graphene light source according to embodiments of the inventive concept, and corresponds to a cross-section taken along line II' of FIG. 5A.

FIG. 5A is a perspective view for describing an organic light emitting element including a graphene light source according to embodiments of the inventive concept. FIG. 5B is a cross-sectional view for describing an organic light emitting element including a graphene light source according to embodiments of the inventive concept, and corresponds to a cross-section taken along line II' of FIG. 5A.

Referring to FIG. 5A and FIG. 5B, the organic light emitting element according to the inventive concept may include a substrate 100, first, second, and third hole injection layers 111, 112, and 113 on the substrate 100, first, second, and third hole transport layers 131, 132, and 133 which are respectively on the first, second, and third hole injection layers 111, 112, and 113, a graphene oxide layer GO on the first hole transport layer 131, an electron transport layer 210 and an electron injection layer 230 on the graphene oxide layer GO, a first electrode EL1 electrically connected to the first hole injection layer 111, and a second electrode EL2 electrically connected to the electron injection layer 230. The graphene oxide layer GO may be referred to as a graphene light source or a light emitting layer of the organic light emitting element. The graphene oxide layer GO may be formed by substantially the same method as described with reference to FIG. 2A to FIG. 2D, and may have substantially the same structure.

The organic light emitting element according to the inventive concept is capable of implementing colors by the principle in which a hole and an electron respectively injected from the first electrode EL1 and the second electrode EL2 are recombined in the light emitting layer and emit light, and emits light when an exciton in which the injected hole and the injected electron are combined drops from an excitation state to a ground state.

The first electrode EL1 may include a first portion EL11 provided on the third hole transport layer 133 and a second portion EL12 provided on the substrate 100 and in contact with a sidewall of the first hole injection layer 111. The first portion EL11 and the second portion EL12 of the first electrode EL1 may be electrically connected to each other through a conductive structure such as a wire.

The second electrode EL2 may include a first portion EL21 provided on the second hole transport layer 132 and a second portion EL22 electron provided on the first portion EL21 and the electron injection layer 230. The first portion EL21 and the second portion EL22 of the second electrode EL2 may be electrically connected to each other through a conductive structure such as a wire.

The first, second, and third hole injection layers 111, 112, and 113 may be spaced from each other in the second direction D2, and the first, second, and third hole transport layers 131, 132, and 133 may be spaced from each other in the second direction D2.

However, this is only an example, and the embodiment of the inventive concept is not limited thereto, and the position and shape of each portion of the first, second, and third hole injection layers 111, 112, and 113, the first, second, and third hole transport layers 131, 132, and 133, the electron transport layer 210, the electron injection layer 230, and the first and second electrodes EL1 and EL2 may be variously modified to implement the light emission of the organic light emitting element according to the inventive concept.

The organic light emitting element according to the inventive concept uses the above-described graphene light source as a light emitting layer, and thus, may emit light in a desired wavelength range through doped graphene. In addition, the organic light emitting element according to the present invention uses a two-dimensional material and may be manufactured by a simple process, and thus, may have reduced manufacturing cost and may be applied to a flexible display device.

Figure 6A:
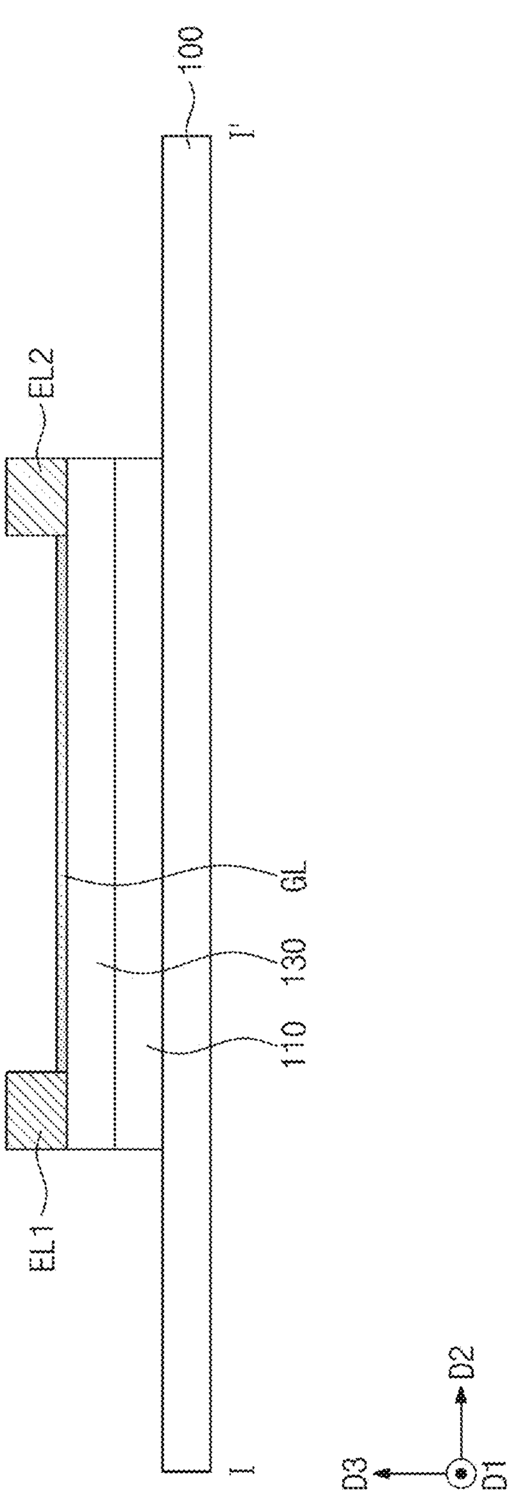
FIG. 6A, FIG. 6B, and FIG. 6C are cross-sectional views for describing a method for manufacturing an organic light emitting element including a graphene light source according to embodiments of the inventive concept, and each correspond to a cross-section taken along line II' of FIG. 5A.
Figure 6B:
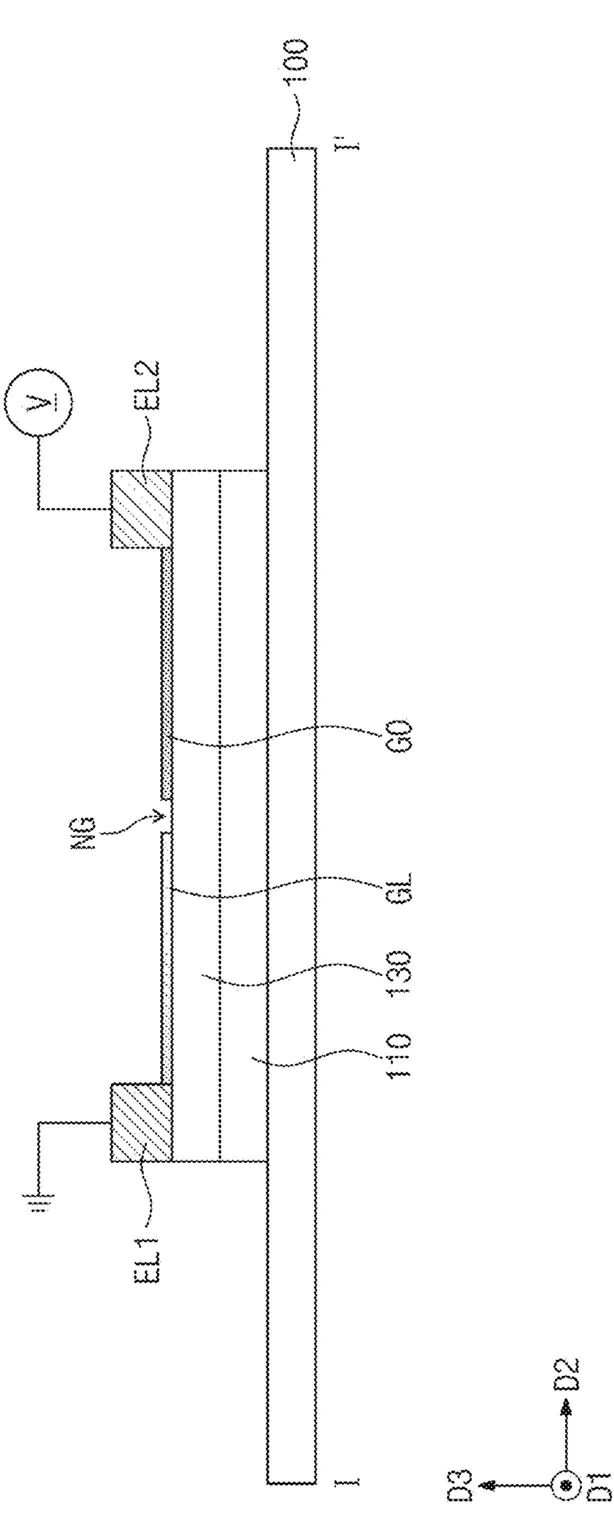
Figure 6C:
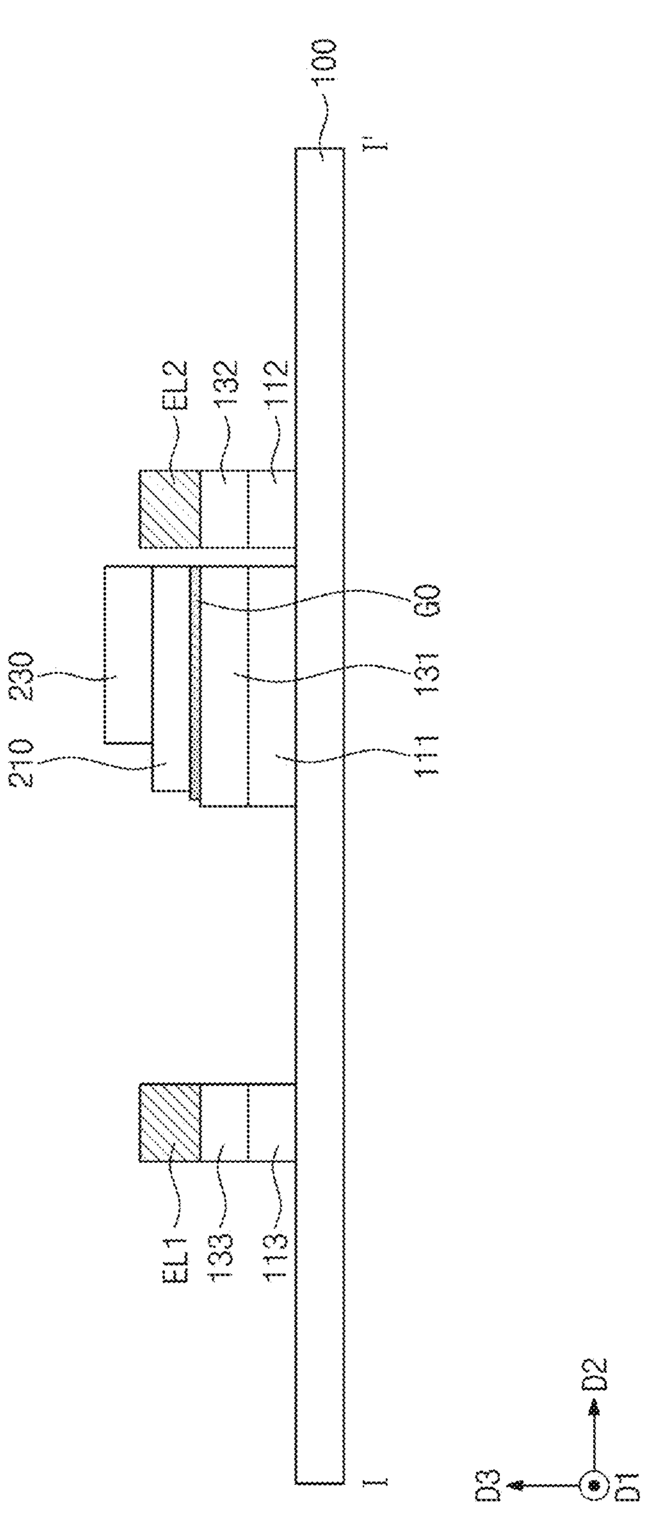

FIG. 6A, FIG. 6B, and FIG. 6C are cross-sectional views for describing a method for manufacturing an organic light emitting element including a graphene light source according to embodiments of the inventive concept, and each correspond to a cross-section taken along line II' of FIG. 5A.

Referring to FIG. 5A and FIG. 6A, a hole injection layer 110 and a hole transport layer 130 may be formed on the substrate 100. On the hole transport layer 130, the first and second electrodes EL1 and EL2, and a graphene layer GL extending in the second direction D2 between the first and second electrodes EL1 and EL2 may be formed. The graphene layer GL may be formed by having, for example, a mono-layer structure or a multi-layer structure in which 2 to 10 layers are stacked.

Referring to FIG. 5A and FIG. 6B, a nano-gap NG may be formed by applying a voltage to the second electrode EL2. At the same time, the graphene layer GL, and the graphene oxide layer GO spaced apart from the graphene layer GL in the second direction D2 may be formed. Thereafter, a graphene quantum dot may be formed in the graphene oxide layer GO. The forming of the graphene oxide layer GO may be performed through substantially the same process as described with reference to FIG. 2A to FIG. 2D.

Referring to FIG. 5A, FIG. 6B, and FIG. 6C, a patterning process may be performed on the graphene layer GL, the graphene oxide layer GO, the hole injection layer 110, and the hole transport layer 130. By the patterning process, the first, second, and third hole injection layers 111, 112, and 113 which are spaced apart from each other in the second direction D2, and the first, second, and third hole transport layers 131, 132, and 133 which are spaced apart from each other in the second direction D2 may be formed, the graphene oxide layer GO may be spaced apart from the second electrode EL2 in the second direction D2, and the graphene layer GL may be removed. Thereafter, an electron transport layer 210 and an electron injection layer 230 may be sequentially formed on the graphene oxide layer GO.

Referring back to FIG. 5A and FIG. 5B, the second portion EL12 of the first electrode EL1 may be formed on the substrate 100, and the second portion EL12 of the first electrode EL1 may be electrically connected to the first portion EL11 of the first electrode EL1 on the third hole transport layer 133. In addition, the second portion EL22 of the second electrode EL2 may be formed on the electron injection layer 230, and the second portion EL22 of the second electrode EL2 may be electrically connected to the first portion EL21 of the second electrode EL2 on the second hole transport layer 132.

A method for manufacturing a graphene light source according to the present invention may be performed by an in-situ process. In addition, the method for manufacturing a graphene light source according to the present invention may be applied (compatible) to a CMOS process, and may be easily implemented to a large area.

In addition, according to the present invention, it is possible to control the formation position of a nano-gap, and accordingly, the light emission position thereof. More specifically, according to the shape or manufacturing process of a graphene layer, it is possible to form a nano-gap at a predetermined (or desired) position, and accordingly, to control the light emission position thereof.

In addition, an organic light emitting element including a graphene light source according to the present invention uses the above-described graphene light source as a light emitting layer, and thus, may emit light in a desired wavelength range through a doped graphene layer. In addition, the organic light emitting element according to the present invention uses a two-dimensional material and may be manufactured by a simple process, and thus, may have reduced manufacturing cost and may be applied to a flexible display device.

Although the embodiments of the present invention have been described with reference to the accompanying drawings, it will be understood by those who have ordinary skills in the art to which the present invention pertains that the present invention may be embodied in other specific forms without changing the technical spirit or essential features thereof. It is therefore to be understood that the above-described embodiments are illustrative in all aspects and not restrictive.

What is claimed is:

1. A method for manufacturing a graphene light source, the method comprising:

forming a graphene layer and electrodes in contact with both sides of the graphene layer;

forming a nano-gap of the graphene layer; and forming a graphene oxide layer by bonding ionized oxygen to a portion of the graphene layer adjacent to one side of the nano-gap, wherein the graphene oxide layer emits green light or blue light.

2. The method for manufacturing a graphene light source of claim 1, wherein the forming of the nano-gap comprises applying a first voltage to the electrodes.

3. The method for manufacturing a graphene light source of claim 1, wherein the forming of the nano-gap comprises performing a patterning process on the graphene layer.

4. The method for manufacturing a graphene light source of claim 3, wherein the patterning process is an E-beam lithography process.

5. The method for manufacturing a graphene light source of claim 1, wherein:

the forming of the nano-gap comprises applying a first voltage to the electrodes; and the forming of the graphene oxide layer comprises applying a second voltage to the electrodes, wherein the first voltage and the second voltage are about 5 V to about 40 V.

6. The method for manufacturing a graphene light source of claim 5, further comprising reducing the graphene oxide layer by applying a third voltage to the electrodes, wherein the third voltage is smaller than the first voltage and the second voltage.

7. The method for manufacturing a graphene light source of claim 6, wherein the third voltage is about 5 V to about 30 V.

8. The method for manufacturing a graphene light source of claim 1, wherein:

the electrodes comprise a first electrode and a second electrode; and the graphene layer comprises:

a first portion adjacent to the first electrode;

a second portion adjacent to the second electrode;

a third portion connected to the first portion and decreasing in width toward the second portion;

a fourth portion connected to the second portion and decreasing in width toward the first portion; and a fifth portion provided between the third portion and the fourth portion.

9. The method for manufacturing a graphene light source of claim 8, wherein the forming of the nano-gap comprises removing the fifth portion of the graphene layer.

10. The method for manufacturing a graphene light source of claim 1, wherein the width of the nano-gap is about 0.6 nm to about 10 nm.

11. The method for manufacturing a graphene light source of claim 1, further comprising injecting gas containing nitrogen into the graphene layer, wherein the graphene layer includes graphene not doped with impurities or graphene doped with nitrogen.

12. The method for manufacturing a graphene light source of claim 1, wherein the nano-gap is formed at a predetermined position according to the shape or manufacturing process of the graphene layer.

13. An organic light emitting element comprising:

a substrate;

a hole injection layer on the substrate;

a hole transport layer on the hole injection layer;

a graphene oxide layer on the hole transport layer;

an electron transport layer on the graphene oxide layer;

an electron injection layer on the electron transport layer;

a first electrode electrically connected to the hole injection layer; and a second electrode electrically connected to the electron injection layer, wherein:

the graphene oxide layer includes a graphene quantum dot; and the graphene oxide layer is configured to emit green light or blue light.

14. The organic light emitting element of claim 13, wherein the graphene quantum dot comprises ionized oxygen atoms.

15. The organic light emitting element of claim 13, wherein the graphene oxide layer comprises graphene not doped with impurities or graphene doped with nitrogen.

16. The organic light emitting element of claim 13, wherein the graphene oxide layer has a mono-layer structure or a multi-layer structure in which 2 to 10 layers are stacked.

17. The organic light emitting element of claim 13, wherein the graphene oxide layer comprises a hydroxyl group having an oxygen functional group bonded to a carbon atom.

18. A method for manufacturing an organic light emitting element including a graphene light source, the method comprising:

sequentially forming a hole injection layer, a hole transport layer, and a graphene layer on a substrate;

forming electrodes in contact with both sides of the graphene layer;

forming a graphene quantum dot in the graphene layer;

performing a patterning process on the hole injection layer, the hole transport layer, and the graphene layer;

sequentially forming an electron transport layer and an electron injection layer on the graphene quantum dot of the graphene layer; and electrically connecting the electrodes to the hole injection layer and the electron injection layer;

wherein the forming of the graphene quantum dot includes:

forming a nano-gap of the graphene layer; and forming a graphene oxide layer by bonding ionized oxygen to a portion of the graphene layer adjacent to one side of the nano-gap.

19. The method for manufacturing an organic light emitting element including a graphene light source of claim 18, wherein the graphene layer adjacent to the other side of the nano-gap is removed by the patterning process.

20. The method for manufacturing an organic light emitting element including a graphene light source of claim 18, wherein the graphene oxide layer is configured to emit green light or blue light.

* * * * *